(12) United States Patent
Dhindsa et al.

(10) Patent No.: US 8,262,922 B2
(45) Date of Patent: *Sep. 11, 2012

(54) PLASMA CONFINEMENT RINGS HAVING REDUCED POLYMER DEPOSITION CHARACTERISTICS

(75) Inventors: Rajinder Dhindsa, San Jose, CA (US);
Felix Kozakevich, Sunnyvale, CA (US);
James H. Rogers, Milpitas, CA (US);
David Trussell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1051 days.

This patent is subject to a terminal disclaimer.

(21) Appl. No.: 12/230,236

(22) Filed: Aug. 26, 2008

(65) Prior Publication Data

US 2008/0318433 A1    Dec. 25, 2008

Related U.S. Application Data

(62) Division of application No. 11/083,241, filed on Mar. 18, 2005, now Pat. No. 7,430,986.

(51) Int. Cl.
*H01L 21/302* (2006.01)

(52) U.S. Cl. ........... 216/67; 438/710; 438/714; 438/905

(58) Field of Classification Search ........................ None
See application file for complete search history.

(56) References Cited

U.S. PATENT DOCUMENTS

| | | | |
|---|---|---|---|
| 5,534,751 A * | 7/1996 | Lenz et al. | ............... 315/111.71 |
| 5,882,411 A | 3/1999 | Zhao et al. | |
| 5,964,947 A | 10/1999 | Zhao et al. | |
| 5,977,552 A | 11/1999 | Foad | |
| 5,998,932 A | 12/1999 | Lenz | |
| 6,008,130 A | 12/1999 | Henderson et al. | |
| 6,009,830 A | 1/2000 | Li et al. | |
| 6,019,060 A | 2/2000 | Lenz | |
| 6,050,216 A | 4/2000 | Szapucki et al. | |
| 6,073,577 A | 6/2000 | Lilleland et al. | |
| 6,079,356 A | 6/2000 | Umotoy et al. | |
| 6,090,304 A | 7/2000 | Zhu et al. | |
| 6,092,486 A | 7/2000 | Mabuchi et al. | |
| 6,095,083 A | 8/2000 | Rice et al. | |
| 6,096,161 A | 8/2000 | Kim et al. | |
| 6,123,775 A | 9/2000 | Hao et al. | |

(Continued)

FOREIGN PATENT DOCUMENTS

JP    A2004-079557 A    3/2004

(Continued)

OTHER PUBLICATIONS

International Preliminary Report on Patentability mailed Mar. 17, 2009 for PCT/US2006/009300.

(Continued)

*Primary Examiner* — Anita Alanko
(74) *Attorney, Agent, or Firm* — Buchanan Ingersoll & Rooney PC

(57) ABSTRACT

Plasma confinement ring assemblies are provided that include confinement rings adapted to reach sufficiently high temperatures on plasma-exposed surfaces of the rings to avoid polymer deposition on those surfaces. The plasma confinement rings include thermal chokes adapted to localize heating at selected portions of the rings that include the plasma exposed surfaces. The thermal chokes reduce heat conduction from those portions to other portions of the rings, which causes selected portions of the rings to reach desired temperatures during plasma processing.

12 Claims, 5 Drawing Sheets

U.S. PATENT DOCUMENTS

| | | | |
|---|---|---|---|
| 6,129,808 A * | 10/2000 | Wicker et al. | 156/345.1 |
| 6,170,429 B1 | 1/2001 | Schoepp et al. | |
| 6,178,919 B1 | 1/2001 | Li et al. | |
| 6,237,528 B1 | 5/2001 | Szapucki et al. | |
| 6,245,192 B1 | 6/2001 | Dhindsa et al. | |
| 6,254,993 B1 | 7/2001 | Mercuri | |
| 6,260,360 B1 | 7/2001 | Wheeler | |
| 6,286,451 B1 | 9/2001 | Ishikawa et al. | |
| 6,363,624 B1 | 4/2002 | Pang et al. | |
| 6,376,385 B2 | 4/2002 | Lilleland et al. | |
| 6,391,787 B1 | 5/2002 | Dhindsa et al. | |
| 6,408,786 B1 | 6/2002 | Kennedy et al. | |
| 6,415,736 B1 | 7/2002 | Hao et al. | |
| 6,423,175 B1 | 7/2002 | Huang et al. | |
| 6,432,831 B2 | 8/2002 | Dhindsa et al. | |
| 6,451,703 B1 * | 9/2002 | Liu et al. | 438/710 |
| 6,454,898 B1 | 9/2002 | Collins et al. | |
| 6,464,843 B1 * | 10/2002 | Wicker et al. | 204/192.15 |
| 6,477,980 B1 | 11/2002 | White et al. | |
| 6,527,911 B1 | 3/2003 | Yen et al. | |
| 6,583,064 B2 | 6/2003 | Wicker et al. | |
| 6,666,924 B1 | 12/2003 | van Bilsen | |
| 6,716,762 B1 * | 4/2004 | Lenz | 438/710 |
| 6,812,646 B2 | 11/2004 | Windhorn et al. | |
| 6,841,943 B2 | 1/2005 | Vahedi et al. | |
| 6,887,340 B2 * | 5/2005 | Dhindsa et al. | 156/345.3 |
| 7,429,306 B2 * | 9/2008 | Ma | 156/345.26 |
| 7,430,986 B2 * | 10/2008 | Dhindsa et al. | 118/723 E |
| 7,455,748 B2 * | 11/2008 | Keil et al. | 156/345.46 |
| 7,713,379 B2 * | 5/2010 | Rogers | 156/345.43 |
| 7,837,825 B2 * | 11/2010 | Fischer | 156/345.47 |
| 7,879,184 B2 * | 2/2011 | Hudson et al. | 156/345.38 |
| 2002/0086118 A1 * | 7/2002 | Chang et al. | 427/447 |
| 2003/0029567 A1 | 2/2003 | Dhindsa et al. | |
| 2003/0084999 A1 * | 5/2003 | Parsons et al. | 156/345.43 |
| 2003/0092278 A1 * | 5/2003 | Fink | 438/710 |
| 2004/0065656 A1 | 4/2004 | Inagawa et al. | |
| 2004/0084410 A1 | 5/2004 | Lenz | |
| 2004/0211517 A1 * | 10/2004 | Annapragada et al. | 156/345.47 |
| 2004/0224128 A1 | 11/2004 | Chang et al. | |
| 2005/0001556 A1 | 1/2005 | Hoffman et al. | |
| 2005/0133160 A1 | 6/2005 | Kennedy et al. | |
| 2006/0157201 A1 | 7/2006 | Hoffman et al. | |
| 2006/0172542 A1 * | 8/2006 | Bera et al. | 438/706 |
| 2008/0314522 A1 * | 12/2008 | Bera et al. | 156/345.33 |
| 2010/0178774 A1 * | 7/2010 | Rogers | 438/710 |

FOREIGN PATENT DOCUMENTS

| | | |
|---|---|---|
| JP | A2005-053730 A | 3/2005 |
| WO | WO01/75932 A2 | 10/2001 |
| WO | WO03/003403 A1 | 1/2003 |
| WO | WO2004/034445 A2 | 4/2004 |

OTHER PUBLICATIONS

Partial translation of Japanese Office Action mailed Apr. 1, 2011 for Japanese Appln. No. 2008-501997.

English translation of Israeli Examination Report dated Apr. 26, 2011 for Israeli Appln. No. 185670.

Supplemental European Search Report dated Sep. 30, 2010 for European Patent Appin. No. 06738371.1-1226.

Search Report and Written Opinion dated Aug. 18, 2010 for Singapore Patent Appln. No. 200902494-4.

International Search Report and Written Opinion for International Application No. PCT/US06/09300 dated Feb. 12, 2008.

T.B. Gorczyca et al., "Lifetime Measurements of Silicon Wafers Exposed to Opaque Quartz Materials", Technical Information Series, 98CRD058, Apr. 1998, Class 1, pp. 1-11, GE Product Dept., Willoughby, Ohio.

International Search Report and Written Opinion for Singapore Application No. 200706480-1.

* cited by examiner

PLASMA CONFINEMENT RINGS HAVING REDUCED POLYMER DEPOSITION CHARACTERISTICS

CROSS-REFERENCE TO RELATED APPLICATIONS

This application is a divisional application of U.S. application Ser. No. 11/083,241 entitled PLASMA CONFINEMENT RINGS HAVING REDUCED POLYMER DEPOSITION CHARACTERISTICS, filed on Mar. 18, 2005, now U.S. Pat. No. 7,430,986 B2 the entire content of which is hereby incorporated by reference.

BACKGROUND

Plasma processing chambers can include an upper electrode and a lower electrode. The upper electrode typically faces a substrate support adapted to support a semiconductor substrate during plasma processing. During the plasma processing, power is supplied to one or both electrodes to activate the process gas and produce the plasma to process the substrate.

Plasma etching can be performed in plasma processing chambers to etch selected materials provided as layers on a semiconductor substrate. The processing conditions are chosen so that the plasma etches desired features in selected portions of the layers.

SUMMARY

A preferred embodiment of a plasma confinement ring assembly for a plasma processing chamber comprises a plurality of plasma confinement rings. Each of the plasma confinement rings includes an inner portion having a plasma-exposed inner diametric surface, an outer portion disposed radially outwardly from the inner portion, and at least one thermal choke. The thermal choke is adapted to reduce heat conduction from the inner portion to the outer portion when the inner diametric surface is exposed to plasma in the plasma processing chamber. As a result, the inner diametric surface reaches a sufficiently high temperature to substantially prevent polymer deposition thereon.

Another preferred embodiment of a plasma confinement ring assembly for a plasma processing chamber comprises a mounting ring and a plurality of plasma confinement rings adapted to be suspended below the mounting ring. The plasma confinement rings comprise an upper plasma confinement ring and a plurality of lower plasma confinement rings. The upper plasma confinement ring includes a top surface facing the mounting ring and a plasma-exposed bottom surface disposed radially inward from the second plasma confinement rings. At least a portion of the top surface of the upper plasma confinement ring is opaque to IR radiation so as to enhance heating of the upper plasma confinement ring. As a result, the bottom surface reaches a sufficiently high temperature to substantially prevent polymer deposition thereon when the bottom surface is exposed to the plasma.

A preferred embodiment of a method of processing a semiconductor substrate in a plasma processing chamber comprises supplying a process gas into a plasma processing chamber comprising a plurality of plasma confinement rings, which each include a plasma-exposed surface; and producing a plasma from the process gas and etching a semiconductor substrate in the plasma processing chamber. During the etching, the plasma-exposed surfaces of the plasma confinement rings reach a sufficiently high temperature to substantially prevent polymer deposition thereon.

BRIEF DESCRIPTION OF THE DRAWING FIGURES

DETAILED DESCRIPTION OF PREFERRED EMBODIMENTS

Figure 1:
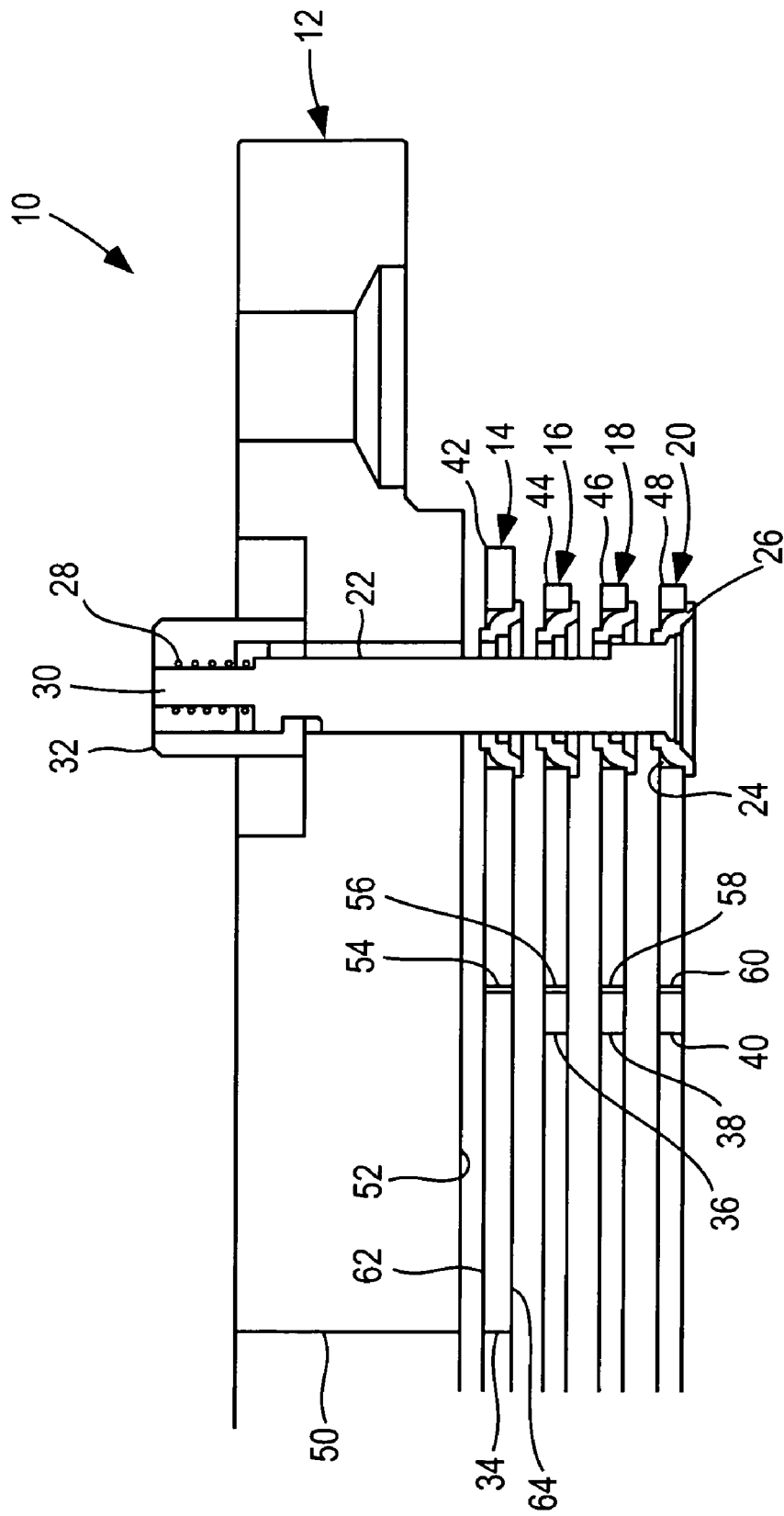
FIG. 1 illustrates a portion of a preferred embodiment of a plasma confinement ring assembly.

Parallel-plate plasma processing chambers, such as capacitively-coupled chambers, include an upper electrode, such as a showerhead electrode, and a lower electrode. The upper electrode typically faces a semiconductor substrate to be processed. During the plasma processing, power is supplied to one or both electrodes to activate the process gas and produce the plasma to process the substrate.

Interior surfaces of such plasma processing chambers can be powered surfaces (e.g., "RF hot surfaces"), grounded surfaces, or floating surfaces (comprised of insulating materials). Different energy is supplied to, or impinges, on these different types of surfaces during plasma processing. Particularly, heating of a chamber part in a parallel-plate plasma processing chamber depends upon the ion energy and the ion flux supplied to the part's exposed surfaces, and on the infrared (IR) energy absorption characteristics of the part. Grounded (return path) surfaces and powered surfaces receive significant ion energy from plasma, which causes these surfaces to be heated more than floating parts or surfaces, and also to reach significantly different temperatures.

Highly-polymerizing process gas chemistries, such as process gases containing fluorocarbons, hydrofluorocarbons, or precursors of such gases, can be used to etch dielectric materials, such as silicon oxide. During such plasma etch processes, polymer tends to deposit on some internal surfaces of the plasma processing chamber. The polymer deposits are undesirable because they can flake off of the surfaces and contaminate processed substrates (e.g., processed wafers), as well as the chamber. However, as device features continue to shrink, it becomes increasingly desirable to maintain plasma-exposed chamber surfaces clean from wafer-to-wafer to achieve repeatable process results. Accordingly, it is desirable to reduce, and preferably to avoid, such polymer deposits on internal surfaces of chamber parts.

Generally, polymer deposits are more likely to form on cooler plasma-exposed surfaces of the plasma processing chamber during plasma processing operations. Floating surfaces tend to be cooler surfaces and consequently are generally more prone to develop polymer buildup on them as compared to powered or grounded surfaces. The temperature increase, $\Delta T$, of a plasma-exposed part or surface during plasma processing depends on the amount of heat, Q, added to the part or surface, and the mass, m, and the specific heat, c, of the part; according to the following relationship: $Q=mc\Delta T$. Accordingly, for a given amount of heat added to a part, increasing the part mass decreases the increase in temperature of the part. Consequently, a part having a high mass may not reach a sufficiently high temperature during plasma processing to avoid polymer deposition on plasma exposed surfaces of the part. Increasing the heat capacity of a part also decreases the temperature reached by the part for a given amount of heat added to the part.

In addition, during plasma processing, heat can be transferred to and/or from a part to other chamber surfaces by thermal conduction (when the part is in physical contact with another surface), radiation (when electromagnetic waves carry heat to and/or from the part) and convection (when heat is carried by a moving fluid in the chamber). Convective heat losses from parts increase with increasing chamber pressure.

The problem of polymer deposition on plasma-exposed surfaces of some parts in plasma processing chambers can be addressed by actively heating the part(s). For example, chamber walls can be heated to keep their plasma-exposed interior surface(s) at a sufficiently high temperature to avoid polymer deposition on the surface(s). Active temperature control of showerhead electrode assemblies and electrostatic chucks can also be used. However, as such surfaces are powered or grounded and consequently subject to high ion energy, polymer deposition on these surfaces is less likely to occur than on a floating surface even without active heating of the surfaces.

Alternatively, the polymer deposition problem can be addressed by removing as-formed polymer deposits from surfaces. For example, polymer deposits can be removed by employing aggressive plasma chemistries. Alternatively, the plasma chamber can be opened and a wet cleaning technique can be used to remove polymer deposits from chamber surfaces. However, such cleaning techniques reduce process throughput.

In order to achieve desirable process efficiency and etch uniformity, plasma can be confined within a plasma confinement zone defined between the upper and lower electrodes of a parallel-plate plasma processing chamber. Plasma confinement ring assemblies can be used to provide such plasma confinement. Exemplary plasma confinement ring assemblies are disclosed in commonly-owned U.S. Pat. Nos. 5,534,751; 5,998,932; 6,019,060; 6,178,919 and 6,527,911, each of which is incorporated herein by reference in its entirety. As described in U.S. Pat. No. 5,534,751, a plasma confinement ring assembly can include a plurality of plasma confinement rings, which are arranged in a stack to define a plurality of gas passages extending radially through the rings from an inner to an outer surface. Charged particles in the plasma are neutralized as the particles pass through the passages, thereby minimizing the tendency for a discharge outside the plasma confinement zone (i.e., "unconfinement" of the plasma).

As also described in U.S. Pat. No. 5,534,751, plasma confinement ring assemblies may confine polymer deposition during plasma etch processes to only the plasma confinement rings themselves. However, it is desirable to avoid such polymer deposition on the confinement rings in order to avoid potential chamber and substrate contamination problems, as well as to avoid additional chamber cleaning steps to remove as-formed polymer deposits from the plasma confinement rings.

In light of the above-described polymer deposition problem, it has been determined that plasma confinement ring assemblies can be provided that include confinement rings adapted to reach sufficiently high temperatures on plasma-exposed surfaces of the rings to avoid polymer deposition on those surfaces, without employing active heating of the surfaces. More particularly, the plasma confinement rings are adapted to localize heating at selected portions of the rings that include the plasma exposed surfaces. Heating is localized at these selected portions by providing one or more thermal chokes in each of the rings at selected locations to thereby reduce heat conduction from those portions to other portions of the rings that otherwise act as heat sinks in confinement rings without the thermal chokes.

FIG. 1 depicts a preferred embodiment of a plasma confinement ring assembly 10. The plasma confinement ring assembly 10 comprises, in a concentric arrangement, a mounting ring 12 and plasma confinement rings 14, 16, 18 and 20 suspended from the mounting ring 12. The mounting ring 12 and plasma confinement rings 14, 16, 18 and 20 are vertically-movable to provide adjustment. The number of plasma confinement rings of the assembly is not limited to four rings, as shown; alternatively, there can be less than four rings, e.g., three rings, or more than four rings, e.g., five, six or more rings.

The mounting ring 12 and the plasma confinement rings 14, 16, 18 and 20 are floating parts comprised of a suitable electrically insulating material (dielectric). The insulating material can be, for example, quartz, fused silica, silicon nitride, alumina, or a plastic material. High-purity quartz is a preferred material for use in etch processes for dielectric materials. In the embodiment, the mounting ring 12 and each of the plasma confinement rings 14, 16, 18 and 20 are of a single piece of the insulating material.

As shown in FIG. 1, the plasma confinement rings 14, 16, 18 and 20 are connected to the mounting ring 12 by a hanger 22 configured to extend through holes 24 in each of the plasma confinement rings 14, 16, 18 and 20. An insert 26 is preferably provided in each hole 24 to prevent direct contact between the hanger 22 and the plasma confinement rings 14, 16, 18 and 20. A spring 28 is preferably provided on an inner shaft 30 of the hanger 22 to resiliently bias the hanger 22 with respect to a fitting 32 on the hanger 22.

For etching round semiconductor substrates, such as wafers, the plasma confinement rings 14, 16, 18 and 20 include an inner diametric surface 34, 36, 38 and 40, respectively, and an outer diametric surface 42, 44, 46 and 48, respectively. The inner diametric surfaces 34, 36, 38 and 40 are plasma-exposed surfaces. As shown in FIG. 1, the uppermost plasma confinement ring 14 has a greater width in the radial direction than the plasma confinement rings 16, 18 and 20. As also shown, the inner diametric surfaces 36, 38 and 40 of the respective plasma confinement rings 16, 18 and 20 are preferably vertically aligned.

The inner diametric surface 34 of the plasma confinement ring 14 is preferably vertically aligned with the inner diametric surface 50 of the mounting ring 12. By this arrangement, the plasma confinement ring 14 overlies the bottom surface 52 of the mounting ring 12. It has been determined that due to the relatively large thermal mass of the mounting ring 12, without the plasma confinement ring 14, the bottom surface 52 of the mounting ring 12 does not reach a sufficiently high temperature to prevent polymer deposition on the bottom surface 52 during plasma processing. By incorporating the plasma confinement ring 14 separated from the bottom surface 52, the bottom surface 52 is protected from exposure to plasma and polymer deposition on the bottom surface 52 is preferably minimized.

In the embodiment, the plasma confinement rings 14, 16, 18 and 20 include thermal chokes 54, 56, 58 and 60, respectively. Heat is supplied to the plasma confinement rings 14, 16, 18 and 20 by plasma and other heating effects during plasma etching processes. The thermal chokes 54, 56, 58 and 60 reduce heat conduction in the radial outward direction from the locations of the thermal chokes 54, 56, 58 and 60, to thereby enhance heating of the inner portion of the respective plasma confinement rings 14, 16, 18 and 20 defined between the thermal chokes 54, 56, 58 and 60 and the inner diametric surfaces 34, 36, 38 and 40, respectively. Consequently, each of the inner diametric surfaces 34, 36, 38 and 40 preferably reaches a sufficiently high temperature to substantially prevent polymer deposition on these surfaces during plasma processing.

Figure 2:
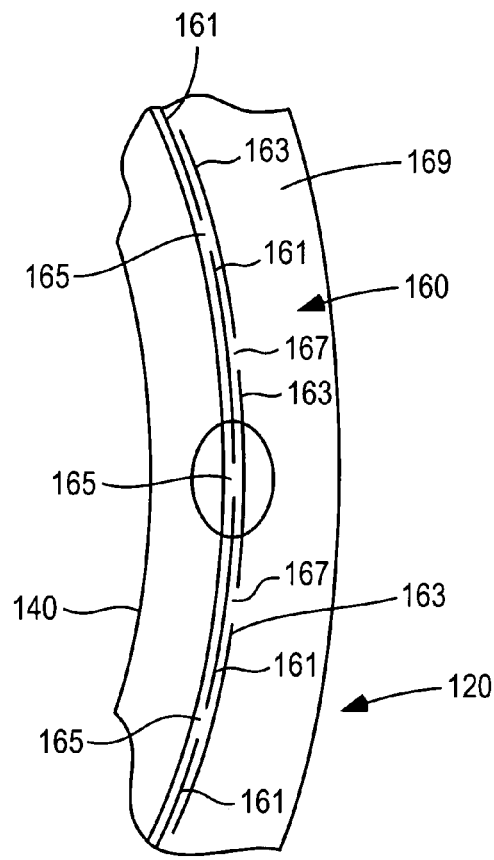
FIG. 2 illustrates a top plan view of a portion of a preferred embodiment of a plasma confinement ring of the plasma confinement ring assembly, wherein the ring includes a thermal choke.
Figure 3:
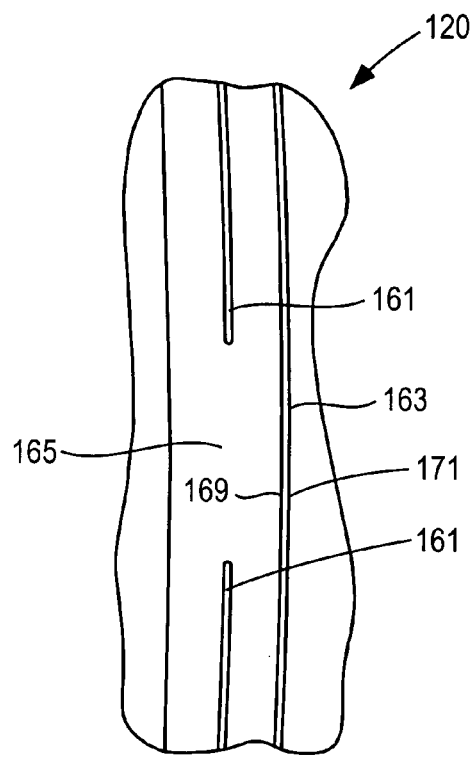
FIG. 3 is an enlarged partial top view of the plasma confinement ring shown in FIG. 2.

FIGS. 2 and 3 depict a portion of a preferred embodiment of a plasma confinement ring 120 including a thermal choke 160. In the embodiment, the mounting ring and/or one or more of the other plasma confinement rings of the plasma confinement ring assembly can also include a thermal choke configured as shown in FIGS. 2 and 3.

The illustrated thermal choke 160 comprises a plurality of inner slots 161 arranged in a discontinuous first circular pattern, and a plurality of outer slots 163 spaced outwardly from the inner slots and arranged in a concentric discontinuous second circular pattern. Adjacent inner slots 161 are separated by inner regions 165, and adjacent outer slots 163 are separated by outer regions 167. As shown in FIG. 2, the inner regions 165 and outer regions 167 are offset from each other around the plasma confinement ring 120. The inner slots 161 and the outer slots 163 preferably extend completely through the thickness of the plasma confinement ring 120. This construction and placement of the thermal choke 160 reduces radial heat transfer to the outer portion 169 of the plasma confinement ring 120, such that the inner diametric surface 140 reaches a sufficiently high temperature to substantially prevent polymer deposition on this surface during plasma processing.

The inner slots 161 and outer slots 163 preferably have a width of from about 0.005 inch to about 0.020 inch. In a preferred embodiment, the inner slots 161 and 163 are formed by a laser ablation technique.

Figure 4:
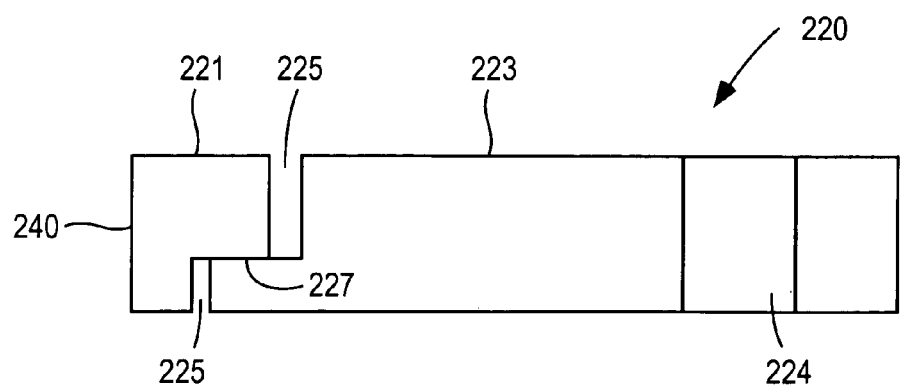
FIG. 4 illustrates a side view of another preferred embodiment of a plasma confinement ring of the plasma confinement ring assembly, which has a two-piece construction.

In another preferred embodiment, one or more of the plasma confinement rings of the plasma confinement ring assembly 10 has a multi-piece construction. For example, the embodiment of the plasma confinement ring 220 shown in FIG. 4 has a two-piece construction and comprises an inner ring portion 221 and an outer ring portion 223. The inner ring portion 221 includes a plasma-exposed inner diametric surface 240. The inner ring portion 221 and the outer portion 223 are preferably comprised of the same insulating material.

In the plasma confinement ring 220, the inner ring portion 221 and outer ring portion 223 are configured to minimize contact between surfaces of the inner ring portion 221 and the outer ring portion 223 at the region 227 (which contact occurs due to gravity). At least one gap is defined between opposed surfaces of the inner ring portion 221 and outer ring portion 223. In the embodiment, the gaps 225 act as thermal chokes. By this construction of the plasma confinement ring 220, heat conduction from the inner ring portion 221 to the outer ring portion 223 occurs only at the region 227 where there is surface contact when the inner diametric surface 240 of inner ring portion 221 is exposed to plasma. Consequently, the inner diametric surface 240 can reach a sufficiently high temperature to substantially prevent polymer deposition on the surface.

In a preferred embodiment, at least one surface of one or more of the plasma confinement rings of the plasma confinement ring assembly can be roughened and/or coated with a material that is opaque to IR (infrared) radiation and can block transmission of the IR radiation. In the embodiment, IR radiation incident on the confinement ring is transmitted through the body of the confinement ring, but is blocked by the roughened and/or coated surface. For example, the confinement ring can be comprised of quartz, or another IR transparent insulting material. By blocking the IR radiation, heating of a selected portion of the confinement ring partially defined by the roughened and/or coated surface is enhanced.

Selected surfaces of the plasma confinement rings can be roughened by a suitable technique, such as shot peening or by machining the surface using a diamond tool that produces a pitted surface. The surfaces can be coated with a suitable IR opaque material. Surfaces that are not exposed to plasma can be coated with alumina.

For example, as shown in FIG. 1, the upper surface 62 of the plasma confinement ring 14 can be roughened and/or coated with an IR opaque material in the region between the inner diametric surface 34 and the thermal choke 54. Consequently, IR radiation incident on the lower surface 64 and/or inner diametric surface 34 of the plasma confinement ring 14 is blocked by the roughened and/or coated upper surface 62, which thereby enhances heating of the portion of the plasma confinement ring 14 between the inner diametric surface 34 and the thermal choke 54. As the surface 64 is not directly exposed to plasma, the IR opaque material can be of a material, such as alumina, that is not preferred for use on plasma-confining surfaces.

In another preferred embodiment, selected surfaces that define the slots formed in the plasma confinement rings can be roughened and/or coated with a material that is opaque to IR radiation. For example, in the embodiment of the plasma confinement ring 120 shown in FIGS. 2 and 3, at least one of the surfaces 169 and 171 can be roughened and/or coated with an IR opaque material to block transmission of IR radiation to affect further heating of the inner diametric surface 140.

Figure 5:
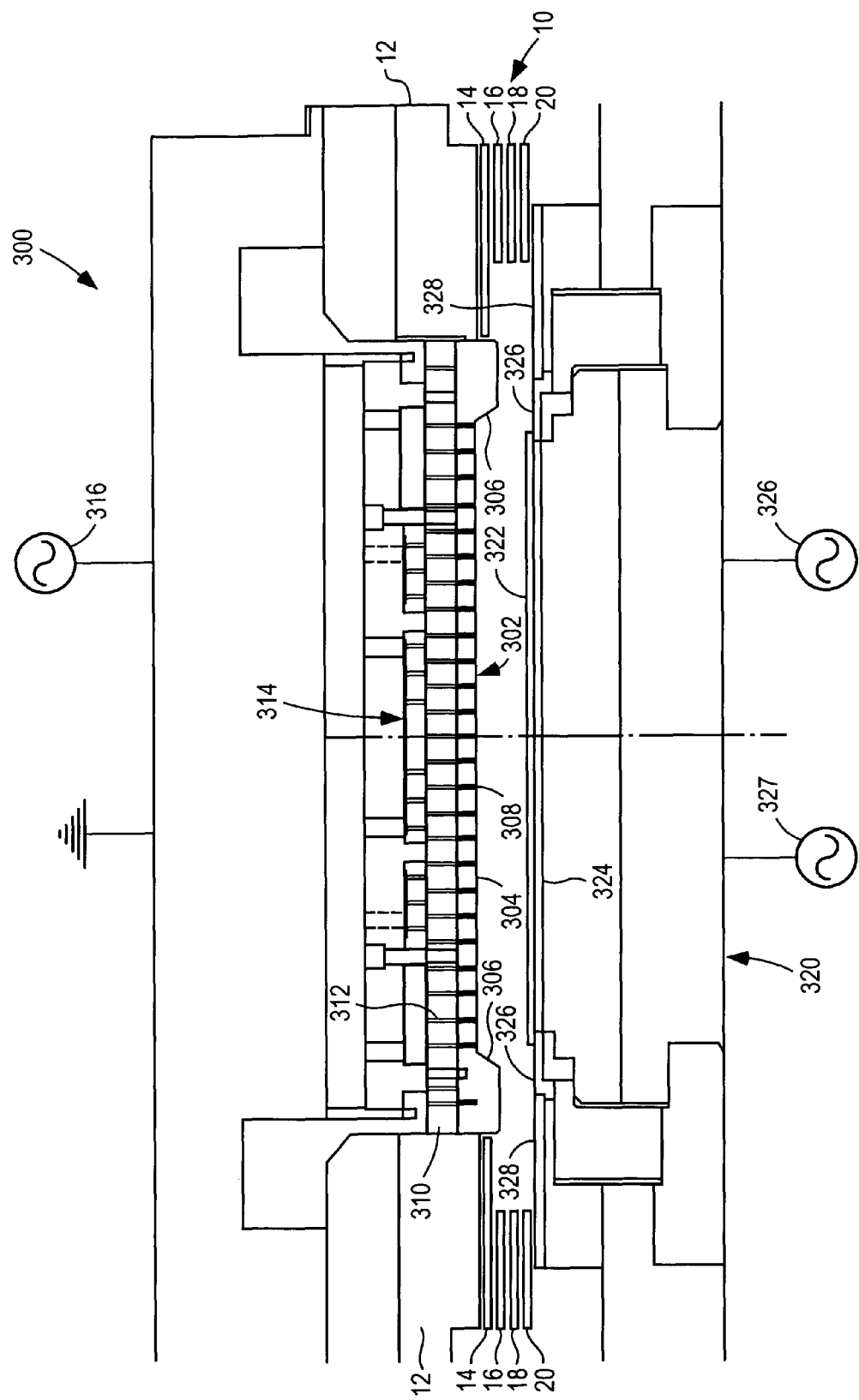
FIG. 5 illustrates a plasma processing chamber including a preferred embodiment of the plasma confinement ring assembly.

FIG. 5 depicts an exemplary embodiment of a capacitively-coupled plasma processing chamber 300 in which the plasma confinement ring assembly 10 is mounted. The plasma processing chamber 300 includes an upper electrode 302 having a bottom surface 304. In the embodiment, the bottom surface 304 includes a step 306 adapted to control a localized density of the plasma formed adjacent the exposed surface of the upper electrode 302, as described in U.S. Pat. No. 6,391,787, which is incorporated herein by reference in its entirety. In the embodiment, the upper electrode 302 is a showerhead electrode including gas passages 308 arranged for distributing process gas into the plasma processing chamber 300. The upper electrode 302 can be comprised of silicon (e.g., single crystal silicon or polycrystalline silicon) or silicon carbide.

In the embodiment, the upper electrode 302 is a single-piece electrode (e.g., for 200 mm wafer processing). The upper electrode 302 is preferably mounted (e.g., elastomer bonded) to a backing member 310 of a suitable material, such as graphite or silicon carbide. The backing member includes gas passages 312 in fluid communication with corresponding gas passages 308 in the upper electrode 302.

In another embodiment, the upper electrode can have a two-piece construction (e.g., for 300 mm wafer processing) and include a single-piece inner electrode member and an outer electrode member surrounding the inner electrode member, such as described in commonly-owned U.S. patent application Ser. No. 10/743,062, now U.S. Pat. No. 7,645,341 B2 which is incorporated herein by reference in its entirety. In the embodiment, the backing member preferably includes a backing plate co-extensive with the inner electrode member and a backing ring co-extensive with the outer electrode member, as described in U.S. patent application Ser. No. 10/743,062.

In the embodiment of the plasma processing chamber 300 shown in FIG. 5, a thermal control plate 314 is preferably provided on the backing member 310. The thermal control plate 314 preferably includes one or more heaters adapted to control the temperature of the upper electrode 302, as described in U.S. patent application Ser. No. 10/743,062.

The plasma processing chamber 300 includes a gas source (not shown) for supplying process gas to the upper electrode 302. The process gas is distributed in the chamber by the gas passages 308 in the upper electrode 302. The upper electrode 302 can be powered by an RF power source 316 via a matching network. In another embodiment, the upper electrode 302 can be electrically grounded to provide a return path for power supplied by a bottom electrode of the substrate support 320 of the plasma processing chamber 300.

In the embodiment, process gas is supplied into the plasma processing chamber 300 at the plasma generation region in the space between the upper electrode 302 and a semiconductor substrate 322, e.g., a semiconductor wafer, supported on a substrate support 320. The substrate support 320 preferably includes an electrostatic chuck 324 that secures the semiconductor substrate 322 on the substrate support by an electrostatic clamping force. The electrostatic chuck 324 acts as a bottom electrode and is preferably biased by at least one of the RF power sources 326, 327 (typically via a matching network).

During plasma processing of the semiconductor substrate 322, the plasma confinement ring assembly 10 confines plasma in a plasma confinement zone between the upper electrode 302 and the semiconductor substrate 322. Edge rings 326, 328 are preferably arranged in surrounding relationship to the semiconductor substrate 322 to focus the plasma so as to improve etch uniformity.

A vacuum pump (not shown) is adapted to maintain a desired vacuum pressure inside the plasma processing chamber 300.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Example 1

Figure 6:
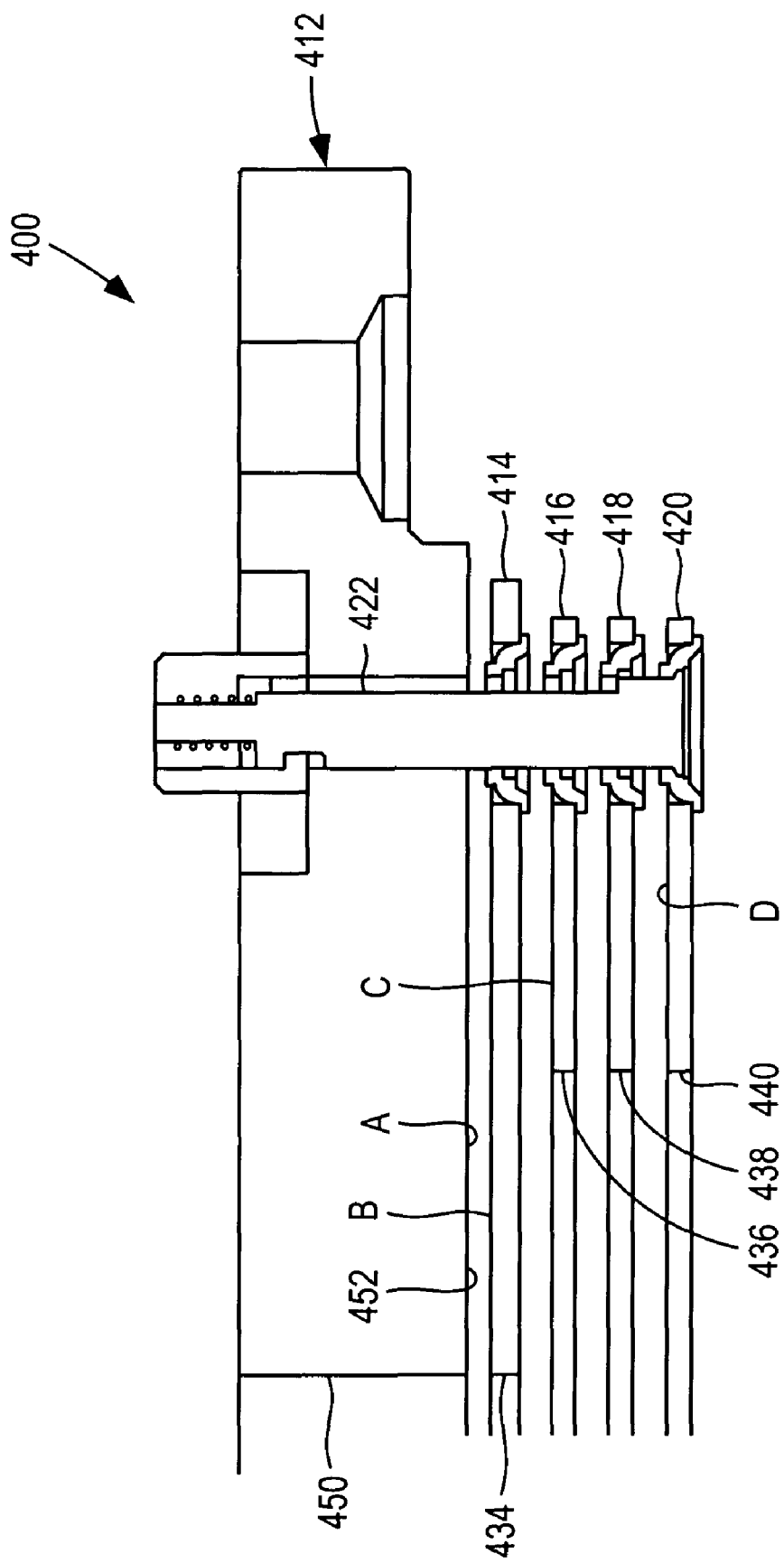
FIG. 6 depicts an embodiment of the plasma confinement ring assembly without thermal chokes that was used in Examples 1 and 2.

In Example 1, a plasma confinement ring assembly 400 as shown in FIG. 6 was used in a parallel-plate, capacitively-coupled plasma processing chamber. As shown, the plasma confinement ring assembly 400 generally has the same construction as the assembly 10 shown in FIG. 1; however, the plasma confinement rings 414, 416, 418 and 420 do not include thermal chokes. The plasma confinement rings were of quartz.

In Example 1, the following dielectric etch process conditions were used to process 85 wafers: 45 mT chamber pressure/100 W power at a frequency of 2 MHz applied to bottom electrode/800 W power at a frequency of 60 MHz applied to bottom electrode/300 sccm argon/15 sccm $C_4F_8$/10 sccm $O_2$/upper electrode temperature of 140° C./bottom electrode temperature of 20° C. An oxygen cleaning step was performed after etching each wafer using the following process conditions: 500 mT chamber pressure/200 W power at a frequency of 27 MHz applied to bottom electrode/300 W power at a frequency of 60 MHz applied to bottom electrode/2000 sccm $O_2$/40 seconds.

As shown in FIG. 6, temperatures were measured using thermocouples attached at location A on the bottom surface 452 of the mounting ring 412, location B on the top surface of the confinement ring 414, location C at the top surface of the confinement ring 416, and location D at the top surface of the confinement ring 420.

The following temperatures were measured at these locations during the plasma processing: location A—about 66° C./location B—about 110° C. to about 116° C./location C—about 82° C./location D—about 82° C. to about 104° C. Following etching of the wafers, the plasma processing chamber was opened and the confinement ring assembly 400 was visibly examined for the presence of polymer deposition. No polymer deposition was observed on the plasma confinement ring 414. However, polymer deposition was observed on the plasma-exposed, inner diametric surfaces 436, 438 and 440 of the plasma confinement rings 416, 418 and 420, indicating that these surfaces did not reach a sufficiently high temperature to prevent polymer deposition.

Example 2

Example 2 used the plasma confinement ring assembly 400 shown in FIG. 6 in a parallel-plate, capacitively-coupled plasma processing chamber to etch 100 wafers using the following dielectric etch process conditions: 45 mT chamber pressure/1100 W power at a frequency of 2 MHz applied to bottom electrode/800 W power at a frequency of 60 MHz applied to bottom electrode/300 sccm argon/28 sccm $C_4F_8$/13 sccm $O_2$/upper electrode temperature of 140° C./bottom electrode temperature of 20° C. An oxygen cleaning step was performed after etching each wafer using the following process conditions: 500 mT chamber pressure/250 W power at a frequency of 27 MHz applied to bottom electrode/25 W power at a frequency of 60 MHz applied to bottom electrode/2000 sccm $O_2$/40 seconds.

Following etching of the wafers, the plasma processing chamber was opened and the confinement ring assembly 400 was visibly examined for the presence of polymer deposition. No polymer deposition was observed on the plasma confinement ring 414. However, polymer deposition was observed on the plasma-exposed, inner diametric surfaces 436, 438 and 440 of the plasma confinement rings 416, 418 and 420, indicating that these surfaces did not reach a sufficiently high temperature to prevent polymer deposition.

Example 3

Figure 7:
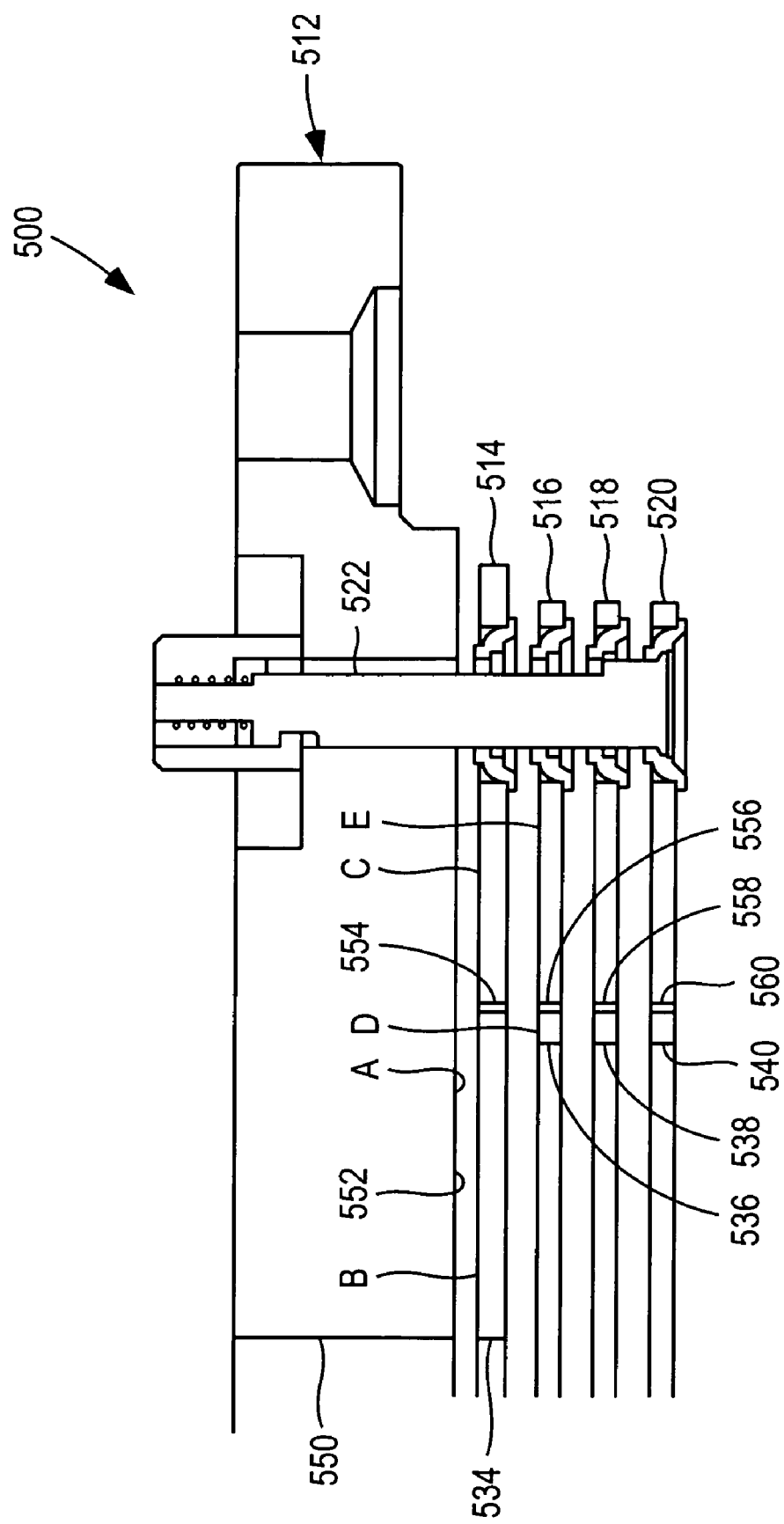
FIG. 7 depicts an embodiment of the plasma confinement ring assembly including thermal chokes that was used in Example 3.

In Example 3, a plasma confinement ring assembly 500 as shown in FIG. 7 was used in a parallel-plate, capacitively-coupled plasma processing chamber. As shown, the plasma confinement ring assembly 500 has the same construction as the assembly 10 shown in FIG. 1, and includes thermal chokes 554, 556, 558 and 560 on the respective plasma confinement rings 514, 516, 518 and 520. The thermal chokes 554, 556, 558 and 560 were slots formed in a concentric, discontinuous circular arrangement, such as shown in FIG. 2. The slots had a width of from about 0.010 inch to about 0.015 inch and extended through the thickness of the plasma confinement rings 514, 516, 518 and 520.

In Example 3, the same etch process conditions that were used in Example 2 were used to process 100 wafers.

As shown in FIG. 7, temperatures were measured using thermocouples attached at location A on the bottom surface 552 of the mounting ring 512; location B on the top surface of the confinement ring 514, inwardly from the thermal choke 554; location C at the top surface of the confinement ring 514, outwardly from the thermal choke 554; location D at the top surface of the confinement ring 516, inwardly of the thermal choke 556; and location E at the top surface of the confinement ring 516, outwardly from the thermal choke 556. The following temperatures were measured at these locations: location A—about 71° C. to about 77° C./location B—about 127° C. to about 132° C./location C—about 71° C. to about 77° C./location D—about 116° C. to about 143° C./location E—about 77° C. to about 82° C.

Following etching of the wafers, the plasma processing chamber was opened and the confinement ring assembly 500 was visibly examined for the presence of polymer deposition. No polymer deposition was observed on the plasma confinement ring 514 or on the plasma-exposed, inner diametric surfaces 536, 538 and 540 of the plasma confinement rings 516, 518 and 520, indicating that these surfaces reached a sufficiently high temperature to prevent polymer deposition.

Referring to FIG. 1, the above-described test results demonstrate that by incorporating the uppermost extended plasma confinement ring 14 in the plasma confinement ring assembly, polymer deposition on the thick mounting ring 12 can preferably be prevented. In addition, by providing one or more thermal chokes in the plasma confinement rings 14, 16, 18 and 20, polymer deposition on plasma exposed surfaces of the rings can preferably be prevented.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of processing a semiconductor substrate in a plasma processing chamber, comprising:
    supplying a polymerizing process gas into a plasma processing chamber comprising a plurality of vertically-stacked plasma confinement rings each including a plasma-exposed surface; and
    producing a plasma from the polymerizing process gas and etching a semiconductor substrate in the plasma processing chamber;
    during the etching, the plasma-exposed surface of each of the plasma confinement rings reaches a temperature that prevents polymer deposits produced during etching from forming thereon;
    wherein one or more of the plasma confinement rings comprises at least one circumferentially extending slot, a gap between an inner ring and an outer ring and/or at least one surface that is roughened and/or coated with a material that blocks IR radiation.

2. The method of claim 1, wherein the semiconductor substrate comprises a dielectric material which is etched by the plasma, and the polymerizing process gas contains at least one constituent selected from the group consisting of fluorocarbons, hydrofluorocarbons, fluorocarbon precursors and hydrofluorocarbon precursors.

3. The method of claim 1, wherein the plasma processing chamber comprises a grounded upper electrode, and a lower electrode to which power is applied at two different frequencies.

4. The method of claim 3, wherein the upper electrode is a showerhead electrode.

5. The method of claim 1, wherein one or more of the plasma confinement rings has at least one non-plasma exposed surface that is roughened and/or coated with a material that blocks IR radiation.

6. The method of claim 1, wherein the one or more plasma confinement rings comprises an inner portion having a plasma-exposed inner diametric surface, an outer portion disposed radially outward from the inner portion, and the at least one slot provides at least one thermal choke adapted to reduce heat conduction radially outward from the inner portion to the outer portion when the inner diametric surface is exposed to plasma in the plasma processing chamber, such that the inner diametric surface reaches a temperature that prevents polymer deposits from forming thereon.

7. The method of claim 1, wherein the inner ring is of a dielectric material including an inner diametric surface the outer ring is of a dielectric material and a separate piece of material from the inner ring, the outer ring has a surface supporting a surface of the inner ring, and the at least one gap provides at least one thermal choke between opposed surfaces of the inner ring and outer ring, such that the inner diametric surface reaches a temperature that prevents polymer deposits from forming thereon.

8. The method of claim 7, wherein the outer ring has an upper surface contacting a lower surface of the inner ring, and the inner ring and the outer ring of each of the plasma confinement rings is made of the same dielectric material.

9. The method of claim 8, wherein:
    the upper surface of the outer ring and the lower surface of the inner ring are recessed horizontal surfaces;
    the opposed surfaces of the inner and outer rings are vertical surfaces; and
    upper and lower gaps are defined between the opposed surfaces of the inner and outer rings.

10. The method of claim 8, wherein the inner and outer rings are concentric rings.

11. The method of claim 5, wherein the roughened and/or coated surface is an upper surface of at least one plasma confinement ring.

12. The method of claim 5, wherein the material is alumina.

* * * * *